US011782117B2

(12) United States Patent
Zeller et al.

(10) Patent No.: US 11,782,117 B2
(45) Date of Patent: Oct. 10, 2023

(54) METHOD FOR PRODUCING DIFFUSION-WEIGHTED AND NON-DIFFUSION-WEIGHTED MEASUREMENT DATA BY MAGNETIC RESONANCE

(71) Applicant: Siemens Healthcare GmbH, Erlangen (DE)

(72) Inventors: Mario Zeller, Erlangen (DE); Adam Kettinger, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/708,416

(22) Filed: Mar. 30, 2022

(65) Prior Publication Data
US 2022/0317223 A1 Oct. 6, 2022

(30) Foreign Application Priority Data
Mar. 31, 2021 (DE) ...................... 10 2021 203 259.1

(51) Int. Cl.
*G01R 33/58* (2006.01)
*G01R 33/561* (2006.01)

(52) U.S. Cl.
CPC .......... *G01R 33/58* (2013.01); *G01R 33/561* (2013.01)

(58) Field of Classification Search
CPC .. G01R 33/58; G01R 33/561; G01R 33/5611; G01R 33/56554; G01R 33/56341
See application file for complete search history.

(56) References Cited

U.S. PATENT DOCUMENTS

| 2005/0237057 A1* | 10/2005 | Porter | G01R 33/56341 324/309 |
| 2007/0167732 A1* | 7/2007 | Zwanger | G01R 33/56341 600/410 |
| 2021/0173033 A1* | 6/2021 | Van Den Brink | G01R 33/5611 |

OTHER PUBLICATIONS

Skare, Stefan et al: "Clinical multishot DW-EPI through parallel imaging with considerations of susceptibility, motion, and noise"; Magnetic Resonance in Medicine; An Official Journal of the International Society for Magnetic Resonance in Medicine; 2007; 57. Jg.; Nr. 5; pp.:881-890.

(Continued)

*Primary Examiner* — Gregory H Curran
(74) *Attorney, Agent, or Firm* — Banner & Witcoff Ltd.

(57) ABSTRACT

To acquire measurement data of an object, a first subsampled set of diffusion-weighted measurement data with switching of diffusion gradients for diffusion encoding of the measurement data, using a first echo spacing, and a second subsampled set of non-diffusion-weighted measurement data, using the first echo spacing, are acquired. The first and second subsampled sets of measurement data are supplemented using calibration data to produce first and second complete sets of measurement data. At least the first calibration data, acquired using the first echo spacing, may be used for supplementing the second subsampled set of measurement data to produce a second complete set of measurement data. By supplementing subsampled sets of measurement data with calibration data acquired according to the same echo spacing as the subsampled measurement data, noise signals in the supplemented measurement data are advantageously eliminated.

18 Claims, 3 Drawing Sheets

(56) References Cited

OTHER PUBLICATIONS

Figure 1:
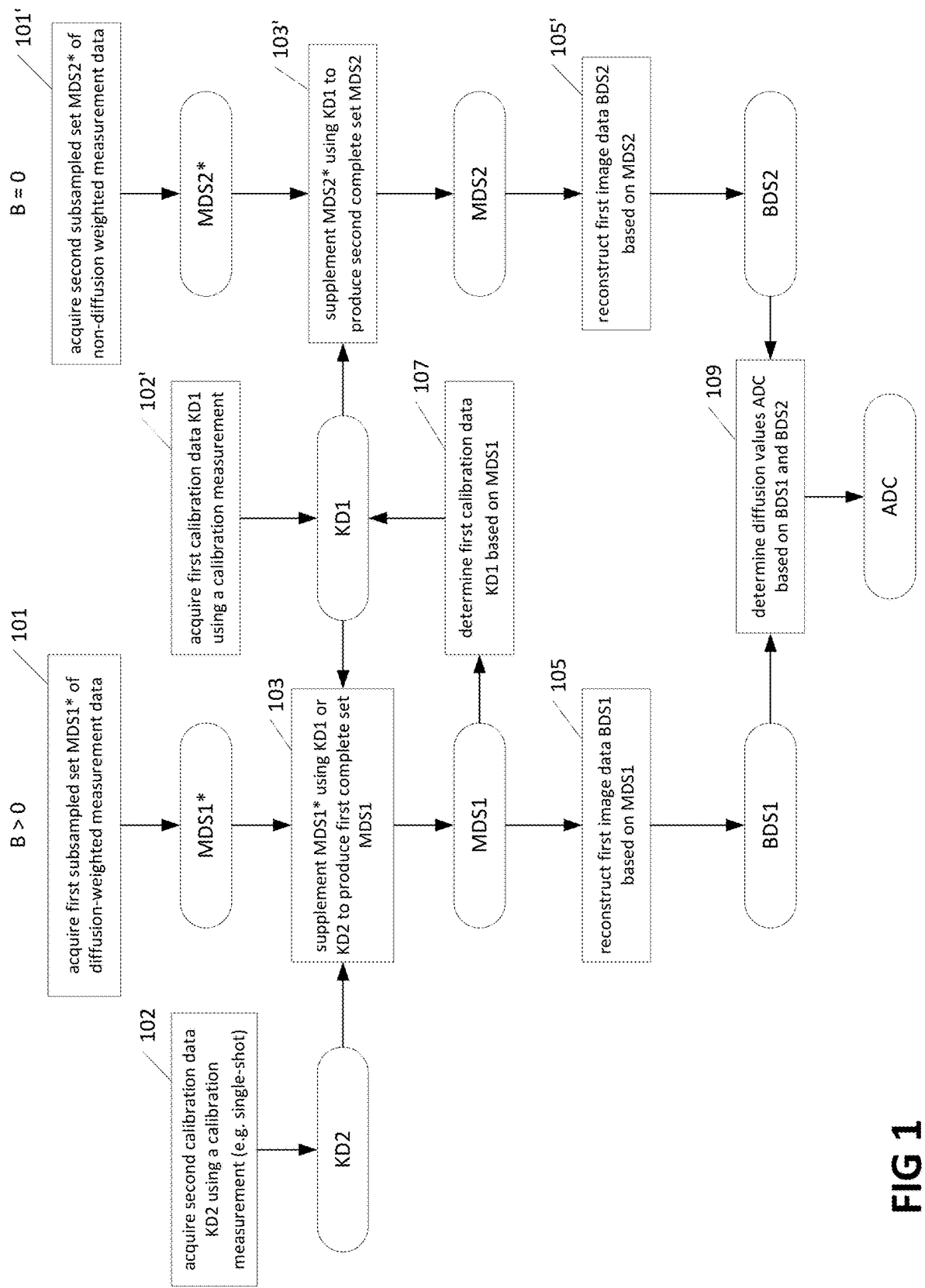

Breuer, Felix A. et al.: "Controlled Aliasing in Parallel Imaging Results in Higher Acceleration (CAIPIRINHA) for Multi Slice Imaging"; in: Magnetic Resonance in Medicine 53: S. 684 691 (2005); 2005.
Setsompop, Kawin, et al.: "Blipped controlled aliasing in parallel imaging (blipped-CAIPI) for simultaneous multislice echo planar imaging with reduced g?factor penalty"; in: Magnetic Resonance in Medicine; vol. 67,5; pp. 1210-1224; 2012; DOI 10.1002/mrm. 23097; 2012.

* cited by examiner

METHOD FOR PRODUCING DIFFUSION-WEIGHTED AND NON-DIFFUSION-WEIGHTED MEASUREMENT DATA BY MAGNETIC RESONANCE

CROSS REFERENCE TO RELATED APPLICATIONS

This patent application claims priority to German Patent Application No. 10 2021 203 259.1, filed Mar. 31, 2021, which is incorporated herein by reference in its entirety.

BACKGROUND

Field

The disclosure relates to a method for producing diffusion-weighted and non-diffusion-weighted measurement data, acquired in a subsampled manner, by means of magnetic resonance.

Related Art

Magnetic resonance technology (hereinafter referred to as MR for short) is a well-known technique for generating images of the interior of an object under examination. In simple terms, the object under examination is positioned in a magnetic resonance device in a comparatively strong, static, homogeneous main magnetic field, also known as a B0 field, with field strengths of 0.2 to 7 Tesla or more, so that its nuclear spins are oriented along the main magnetic field. To trigger nuclear spin resonances that can be measured as signals, radiofrequency excitation pulses (RF pulses) are applied to the object under examination, the nuclear spin resonances triggered are measured as so-called k-space data, and MR images are reconstructed or spectroscopy data is obtained on the basis thereof. For spatial encoding of the measurement data, rapidly switched magnetic gradient fields, called gradients for short, are superimposed on the main magnetic field. A scheme used that describes a temporal sequence of RF pulses to be irradiated and gradients to be switched is referred to as a pulse sequence (scheme), or sequence for short. The acquired measurement data is digitized and stored as complex numerical values in a k-space matrix. From the k-space matrix populated by values, an associated MR image can be reconstructed, e.g. by means of a multidimensional Fourier transform.

So-called parallel acquisition techniques (ppa), such as GRAPPA ("GeneRalized Autocalibrating Partially Parallel Acquisition") or SENSE ("Sensitivity Encoding") in which only a sub-Nyquist sampled number of items of measurement data in k-space are acquired by means of a plurality of RF coils, can be used e.g. to shorten the total measurement time required for acquiring the measurement data or to increase the resolution. Here, less measurement data by a factor F, often called the acceleration factor, is acquired than in the case of full Nyquist sampling. The "missing" measurement data, i.e. data not measured but required for a complete set of measurement data as per Nyquist, are supplemented on the basis of sensitivity data of the RF coils and calibration data used and the measured measurement data. Acceleration factors of F=8 or even higher can be used. An acceleration factor of F=2, which halves the measurement data to be acquired, is employed particularly frequently here.

On the other hand, the desire for ever faster MRI scans in a clinical setting is leading to a renaissance of methods in which a plurality of images are acquired simultaneously. In general, these methods can be characterized in that, at least during part of the measurement, transverse magnetization of at least two slices is selectively used simultaneously for the imaging process ("multi-slice imaging", "slice multiplexing", "simultaneous multi-slice" (SMS)). On the other hand, in established "multi-slice imaging", the signal from at least two slices is acquired alternately, i.e. completely independently of each other, with a correspondingly longer measurement time.

Known SMS methods are, for example, methods which use methods from the abovementioned ppa imaging in the slice selection direction to separate signals acquired in superimposed form from a plurality of slices into signals of the individual slices, wherein knowledge about the sensitivity distribution of the receive coils used for acquiring the measurement data is used as additional information to fill out sub-Nyquist sampled measurement data. These methods also include, for example, the CAIPIRINHA technique as described by Breuer et al. in "Controlled Aliasing in Parallel Imaging Results in Higher Acceleration (CAIPIRINHA) for Multi-Slice Imaging", Magnetic Resonance in Medicine 53, 2005, pp. 684-691, and the blipped CAIPIRINHA technique as described by Setsompop et al. in "Blipped-Controlled Aliasing in Parallel Imaging for Simultaneous Multislice Echo Planar Imaging With Reduced g-Factor Penalty", Magnetic Resonance in Medicine 67, 2012, pp. 1210-1224, wherein the "g-factor" (short for "geometry factor") mentioned in the latter title is a measure of the separability of the different receive coils used.

A magnetic resonance acquisition can be composed of a large number of individual partial measurements in which raw data from different slices of the object under examination is acquired in order to subsequently reconstruct volume image data therefrom.

In addition, however, for many examinations it is also necessary to perform a plurality, i.e. a whole series, of magnetic resonance acquisitions of the object under examination, wherein a specific measurement parameter is varied. On the basis of the measurements, the effect of this measurement parameter on the object under examination is observed in order to subsequently draw diagnostic conclusions. A series is to be understood as meaning at least two, but usually more than two, magnetic resonance acquisitions. A measurement parameter is usefully varied such that the contrast of a particular type of material excited during the measurements, e.g. a tissue type of the object under examination or a chemical substance that is significant for most or certain tissue types, such as water, is influenced as much as possible by varying the measurement parameter. This ensures that the effect of the measurement parameter on the object under examination is particularly clearly visible.

So-called diffusion weighted imaging (DWI) methods are a typical example of series of magnetic resonance acquisitions in which a measurement parameter that strongly influences the contrast is varied. Diffusion is understood as meaning the Brownian motion of molecules in a medium. Diffusion imaging usually involves taking and combining a plurality of images with different diffusion directions and weightings. The strength of the diffusion weighting is usually defined by the so-called "b-value". The diffusion images with different diffusion directions and weightings or rather the images combined therefrom can then be used for diagnostic purposes. Thus, parameter maps having particular diagnostic value can be generated by suitable combinations of the acquired diffusion-weighted images, such as maps representing the "Apparent Diffusion Coefficient (ADC)" or the "Fractional Anisotropy (FA)".

In diffusion-weighted imaging, additional gradients reflecting the diffusion direction and weighting are inserted into a pulse sequence in order to visualize or measure the diffusion properties of the tissue. These gradients cause tissue with rapid diffusion (e.g. cerebral spinal fluid, CSF) to be subject to more signal loss than tissue with slow diffusion (e.g. grey matter in the brain). The resulting diffusion contrast is becoming increasingly important clinically and applications now go far beyond the classic early detection of ischemic stroke.

Diffusion imaging is often based on echo-planar imaging (EPI) because of the short acquisition time of the EPI sequence for each image and its robustness against motion.

In the context of an EPI measurement, the acquired measurement data may have artifacts that adversely affect the imaging of the object under examination. Specifically, during EPI a gradient train is typically applied comprising a plurality of gradients of different polarities in sequential order. Depending on the polarity, the gradient echoes produced by the gradient train are sometimes referred to as even or odd. Because of the alternating polarity of the gradients of the gradient train, measurement data for different lines of k-space is measured in alternating directions. This means, for example, that measurement data for a first line is measured from left to right, and for a second line adjacent to the first line in k-space, from right to left.

During EPI measurements, phase errors can occur, causing artifacts. In particular, there may be shifts in the phase of the measured data for lines in k-space having different measurement directions, as described above. This can occur, for example, due to timing inaccuracies when applying the gradient pulses and/or during digitization in the course of acquiring the measurement data and/or due to eddy current effects. Such a phase offset of the measurement data in adjacent lines of k-space can result in so-called N/2 ghost artifacts. An N/2 ghost artifact of this kind may appear in the MR picture as a "ghost" image of the object under examination and typically have a lower intensity than the actual image of the object under examination and, in addition, may be shifted in the positive and/or negative direction with respect to the actual image of the object under examination.

Methods for correcting such N/2 ghost artifacts are already known. However, these are not satisfactorily effective when using parallel acquisition techniques such as GRAPPA or even corresponding SMS techniques.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIG. 1 shows a schematic flowchart of a method according to an exemplary embodiment of the disclosure.

Figure 2:
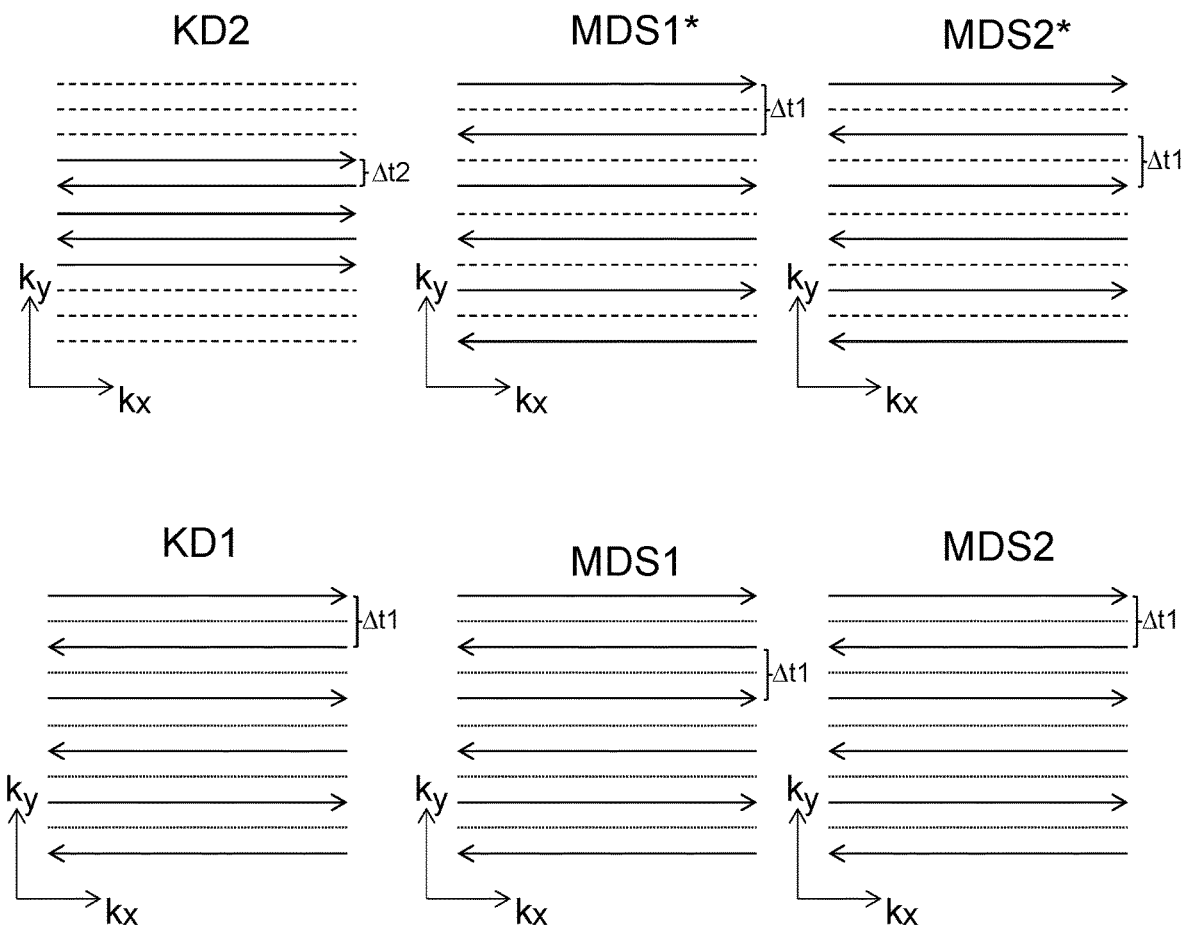

FIG. 2 schematically illustrates example sampling schemes for sets of measurement data and calibration data to be acquired and supplemented in k-space, according to an exemplary embodiment of the disclosure, as can be used in a method according to the disclosure.

Figure 3:
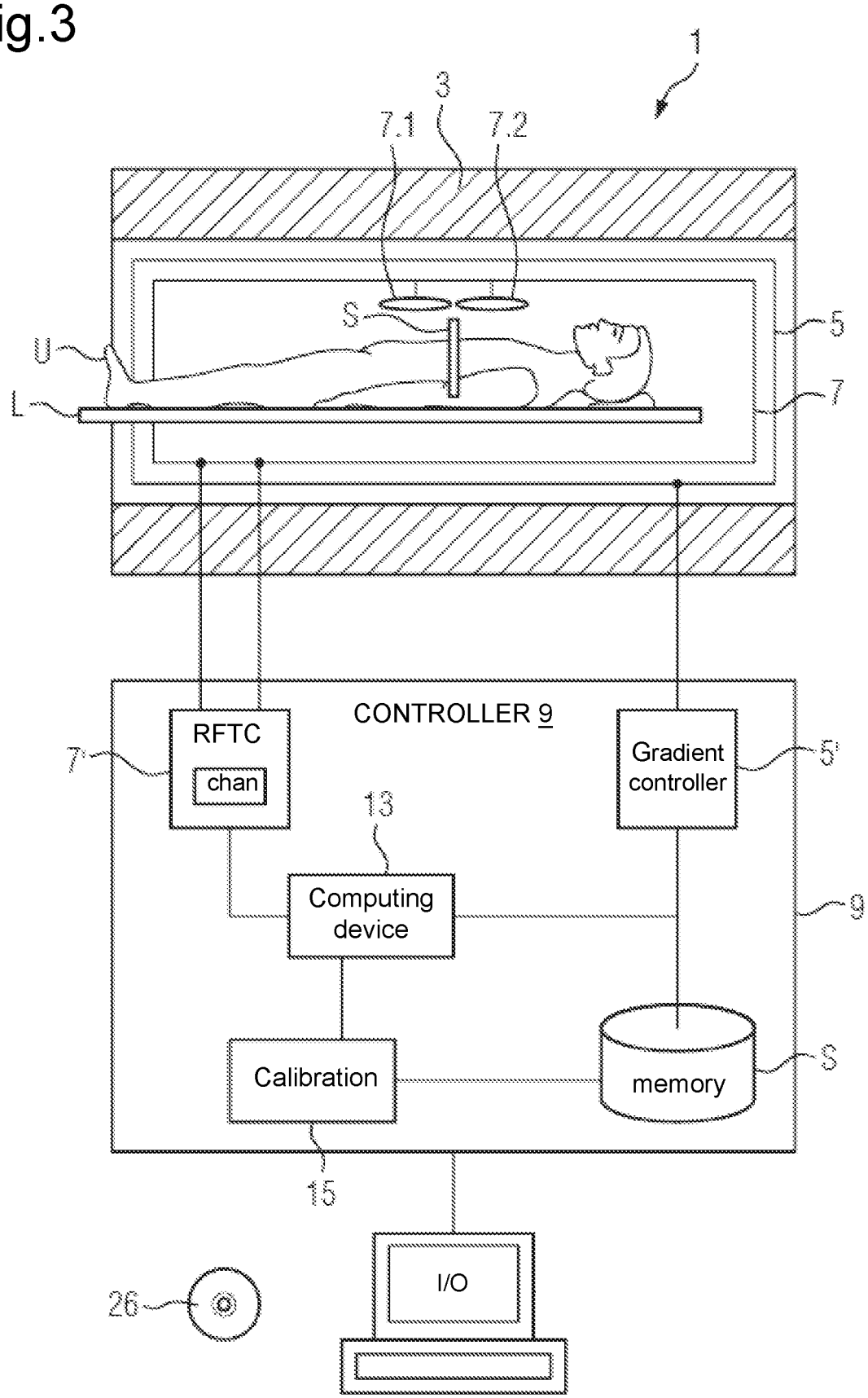

FIG. 3 schematically illustrates a magnetic resonance system according to an exemplary embodiment of the disclosure.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the disclosure is to provide diffusion imaging that prevents artifacts even when parallel acquisition techniques are used.

This object is achieved by a method for acquiring measurement data of an object under examination by means of a magnetic resonance system, a magnetic resonance system, a computer program, and an electronically readable data carrier, according to aspects of the disclosure.

The insight underlying the disclosure is that different effective echo spacings (echo spacing: time interval between two consecutive echoes in an echo train), hereinafter referred to as "echo spacing" for short, of calibration data used in parallel acquisition techniques to supplement non-measured measurement data on the one hand, and of calibration data used when acquiring the measurement data on the other hand, can cause artifacts, particularly if noise signals, e.g. from fat or CSF, are not sufficiently dephased. As a rule, calibration data (to be acquired completely at least in the center of k-space) is acquired with a smaller echo spacing than measurement data (to be acquired incompletely according to an acceleration factor F) in order to minimize the acquisition time of the calibration data. Where possible, calibration data is acquired in a single shot after an RF excitation pulse ("single shot acquisition") in order to also prevent motion and/or pulsation artifacts arising in the calibration data. In the case of longer-duration acquisition times of the calibration data, e.g. performed in a plurality of shots ("multi shot acquisitions"), motion and/or pulsation artifacts can arise due to movements of the object under examination and/or of tissue within the object under examination.

In an exemplary embodiment, a method according to the disclosure for acquiring measurement data of an object under examination by means of a magnetic resonance system comprises the following operations:

acquiring a first subsampled set of diffusion-weighted measurement data, based on the switching of diffusion gradients for diffusion encoding of the measurement data, using a first echo spacing, acquiring a second subsampled set of non-diffusion-weighted measurement data using the first echo spacing, supplementing the first subsampled set of measurement data to produce a first complete set of measurement data and supplementing the second subsampled set of measurement data to produce a second complete set of measurement data by means of calibration data, wherein at least the first calibration data used for supplementing the second subsampled set of measurement data to produce a second complete set of measurement data has been acquired corresponding to the first echo spacing.

By supplementing subsampled, and thus incomplete, sets of, in particular, non-diffusion-weighted measurement data by means of calibration data acquired according to the same echo spacing as the subsampled measurement data to create complete sets of non-diffusion-weighted measurement data, noise signals in the supplemented measurement data that would otherwise result in artifacts in image data reconstructed from complete sets of measurement data supplemented using a different echo spacing are prevented.

However, conventionally acquired calibration data obtained using a different, e.g. shorter, echo spacing than sets of measurement data to be supplemented therewith can be used to supplement at least one subsampled set of diffusion-weighted measurement data to produce a complete set of diffusion-weighted measurement data without the likelihood of artifacts, as the diffusion encoding applied ensures sufficient dephasing of possible noise signals. In particular, a subsampled set of diffusion-weighted measurement data acquired using a diffusion encoding that corresponds to a low, in particular the smallest, b-value of the totality of b-values provided and/or runs in a diffusion direction that is as insensitive as possible to noise, such as eddy currents, can be used to obtain the highest possible signal-to-noise ratio (SNR).

In particular, a set of measurement data supplemented in this way to produce a complete set of diffusion-weighted measurement data can be used directly as calibration data for supplementing a subsampled set of non-diffusion-weighted measurement data, since it is complete, and if, as is usually the case, both diffusion-weighted and non-diffusion-weighted measurement data have been acquired with the same echo spacing. Thus, the method proposed here can be a two-step approach for supplementing incomplete sets of measurement data, using (conventional) calibration data to obtain calibration data according to the disclosure with which artifacts, in particular ghost artifacts, can be avoided without having to change the measurement sequence used.

In an exemplary embodiment, a magnetic resonance system according to the disclosure comprises a magnet unit, a gradient unit, a radiofrequency unit, and a controller configured to carry out a method according to the disclosure and having a calibration data determining unit.

A computer program according to the disclosure implements a method according to the disclosure on a controller when executed on the controller.

The computer program can also be in the form of a computer program product loadable directly into a memory of a controller and having program code means for carrying out a method according to the disclosure when the computer program product is executed in the computing device of the computing system.

An electronically readable data carrier according to the disclosure contains electronically readable control information stored thereon which comprises at least one computer program according to the disclosure and is configured to carry out a method according to the disclosure when the data carrier is used in a control unit of a magnetic resonance system.

The advantages and embodiments detailed in relation to the method apply analogously to the magnetic resonance system, the computer program product, and the electronically readable data carrier.

FIG. 1 is a schematic flow chart of a method according to the disclosure for acquiring measurement data of an object under examination by means of a magnetic resonance system.

A first subsampled set MDS1* of diffusion-weighted (b>0) measurement data is acquired using a first echo spacing $\Delta t1$, subject to the switching of diffusion gradients for diffusion encoding of the measurement data (block 101).

In addition, a second subsampled set MDS2* of non-diffusion weighted (b=0) measurement data is acquired using the first echo spacing $\Delta t1$ but without diffusion encoding (block 101').

The first and the second subsampled set of measurement data MDS1* and MDS2* can be acquired, in particular, as part of a diffusion measurement in which measurement data with different diffusion weights (different b values, including b=0 (no diffusion encoding); in different diffusion directions), is acquired e.g. using an EPI sequence, according to a parallel acquisition technique, e.g. GRAPPA or CAIPIRINHA.

The second subsampled set MDS2* of measurement data is supplemented using first calibration data KD1 acquired according to the first echo spacing $\Delta t1$ (block 103').

First calibration data KD1 can be or may have been acquired in the course of a calibration measurement, e.g. a prior measurement (block 102').

The first subsampled set MDS1* of measurement data is supplemented using first calibration data KD1 or second calibration data KD2 to produce a first complete set MDS1 of measurement data (block 103).

The supplementing of subsampled sets of measurement data MDS1* and MDS2* to produce complete sets of measurement data MDS1 and MDS2 using calibration data KD1 or KD2 can take place in accordance with the parallel acquisition technique used for acquiring the measurement data. Subsampled measurement data can be supplemented in at least one k-space direction, e.g. in the phase encoding direction and/or in the slice selection direction.

The first subsampled set MDS1* of measurement data can be supplemented to produce a first complete set MDS1 of measurement data using second calibration data KD2 acquired according to a second echo spacing $\Delta t2$, wherein the first echo spacing $\Delta t1$ and the second echo spacing $\Delta t2$ are different. In particular, the first echo spacing $\Delta t1$ can be greater than the second echo spacing $\Delta t2$.

Second calibration data KD2 can be or may have been acquired as part of a calibration measurement, e.g. a prior measurement, in particular with one acquisition ("single shot acquisition") (block 102). In order to keep the total measurement time short and/or to keep motion sensitivities low, "single shot" acquisitions of second calibration data KD2, which are usually performed separately from the acquisitions of the measurement data (MDS1*, MDS2*), are particularly recommended.

First calibration data KD1 can be determined from a first subsampled set MDS1* of measurement data (block 107), thereby enabling measurement times for acquisitions of first calibration data KD1 to be eliminated.

For this purpose, first calibration data KD1 can be determined in particular from a first complete set MDS1 of measurement data supplemented using second calibration data KD2 acquired according to a second echo spacing Δt2. For example, measurement data of the first complete set MDS1 of measurement data corresponding to a central k-space region can be used as calibration data KD1. Artifact-avoiding first calibration data KD1 can thus be determined on the basis of second calibration data KD2, e.g. conventionally acquired by means of a single rapid acquisition, and on the basis of the first subsampled set MDS1* of measurement data to be acquired anyway. Both acquisition of second calibration data KD2 and the acquisitions of subsampled first and second sets of measurement data MDS1* and MDS2* can be performed using "single shot" acquisitions in order to avoid motion sensitivities as often occur in "multi-shot" acquisitions.

It is also conceivable for a first complete set MDS1 of measurement data supplemented from a subsampled first set MDS1* of measurement data using second calibration data KD2 to be used as first calibration data KD1, the first complete set MDS1 of measurement data therefore corresponding to first calibration data KD1. A first complete set MDS1 of measurement data is basically suitable to be used as calibration data by virtue of its completeness. The first subsampled set MDS1* of measurement data on which the first complete set MDS1 of measurement data is based was acquired using the first echo spacing Δt1. Thus, the first complete set MDS1 of measurement data satisfies all the necessary conditions for use as first calibration data KD1.

A subsampled first set MDS1* of measurement data, from which first calibration data KD1 is obtained, can be acquired using diffusion encoding which corresponds to a low b-value and/or runs in a diffusion direction that is insensitive to noise.

A low b-value can be e.g. a b-value lying within provided b-values in a lower third having the smallest b-values, in particular the smallest provided b-value. Such a choice of the first subsampled set MDS1* of (diffusion-weighted) measurement data ensures the most favorable signal-to-noise ratio possible in the measurement data thus acquired.

A subsampled first set MDS1* of measurement data from which first calibration data KD1 is obtained can be acquired prior to acquisition of other subsampled first sets MDS1* of measurement data and/or prior to acquisition of subsampled second sets MDS2* of measurement data. As a result, in the course of all the acquisitions to be performed as part of the diffusion measurement, the first calibration data KD1 is already available, at an early point in time, for supplementations to be carried out. In particular, a subsampled first set MDS1* of measurement data, from which first calibration data KD1 is obtained, can be acquired first, possibly after acquisition of second calibration data KD2.

First image data BDS1 can be reconstructed from first complete sets MDS1 of measurement data (block 105), and second image data BDS2 can be reconstructed from second complete sets MDS2 of measurement data (block 105').

The first and second image data BDS1 and BDS2 can each be reconstructed from complete sets of measurement data MDS1 and MDS2, each of which has been supplemented with the same calibration data, in particular with first calibration data KD1. This prevents the use of different calibration data for supplementing sets of non-diffusion-weighted measurement data MDS2 on the one hand and sets of diffusion-weighted measurement data MDS1 on the other from producing incoherences between diffusion-weighted image data BDS1 reconstructed from different supplemented sets of measurement data and non-diffusion-weighted image data BDS2, which can affect the comparability of the diffusion-weighted image data BDS1 with the non-diffusion-weighted image data BDS2.

Reconstructed image data BDS1, BDS2 can be stored, displayed and/or further processed.

Diffusion values, e.g. ADC values, can be determined on the basis of the first image data set BDS1 and the second image data set BDS2 (block 109).

FIG. 2 schematically illustrates possible sampling schemes for above-described sets of measurement data MDS1*, MDS2*, MDS1, MDS2 to be acquired and supplemented and of calibration data KD1, KD2 in k-space, such as can be used in a method according to the disclosure.

In the examples shown, in each sampling scheme, for acquiring measurement data, k-space is sampled along k-space lines oriented in the readout direction kx and perpendicular to the phase encoding direction ky. Non-acquired measurement data is shown as dashed lines, acquired measurement data is shown as arrows (as is commonplace e.g. for EPI sequences, adjacent measured k-space lines are scanned in opposite directions), and supplemented measurement data is shown as dotted lines.

The illustrated sampling scheme for second calibration data KD2 shows that measurement data is acquired in the central region of k-space with an echo spacing Δt2.

The illustrated sampling scheme for a first subsampled set of measurement data MDS1* shows that measurement data is acquired with an acceleration factor F=2, i.e. only in every second line of k-space, using an echo spacing Δt1.

Similarly, the illustrated sampling scheme for a second subsampled set of measurement data MDS2* shows that measurement data is acquired with an acceleration factor F=2, i.e. only in every second line of k-space, using an echo spacing Δt1.

The illustrated sampling scheme for first calibration data KD1 shows that measurement data is acquired with an echo spacing Δt1, and every second line of k-space is supplemented. Such first calibration data KD1 can be obtained e.g. as described above by supplementing a first subsampled set MS1* of measurement data by means of second calibration data KD2.

The illustrated sampling scheme for a first complete set MDS1 of measurement data shows that the measurement data not acquired in the associated first subsampled set MDS1* of measurement data has been made up. This may have been done by means of first or second calibration data KD1 (e.g. to ensure consistent supplementation of non-acquired measurement data for diffusion-weighted measurement data and non-diffusion-weighted measurement data) or KD2 (e.g. to determine first calibration data).

Similarly, the sampling scheme shown for a second complete set MDS2 of measurement data indicates that the measurement data not acquired in the associated second subsampled set MDS2* of measurement data has been made up. This supplementing should have been done by means of first calibration data KD1 (having the same echo spacing) in order to avoid artifacts, in particular fat or CSF ghost artifacts.

FIG. 3 schematically illustrates a magnetic resonance (MR) system 1 according to an exemplary embodiment of the disclosure. The system 1 may comprise a magnet unit 3 for generating the main magnetic field, a gradient unit 5 for generating the gradient fields, a radiofrequency (RF) unit 7 for applying and receiving radiofrequency signals, and a controller 9 configured to carry out a method according to the disclosure. The magnet unit 3, gradient unit 5, and radiofrequency (RF) unit 7 can collectively be referred to as a magnetic resonance (MR) scanner.

In an exemplary embodiment, the controller 9 (and/or one or more components therein) includes processing circuitry configured to perform one or more functions and/or operations of the controller 9, including controlling the MR system 1 (and/or one or more components therein), processing magnetic resonance signals, reconstructing magnetic resonance images, processing input from the user of the magnetic resonance imaging apparatus 10 and/or providing an output to the user. Additionally, the controller 9 may include one or more internal and/or external memories configured to store data, such as control data, computer code executable by the computing device 13, image data, or other data as would be understood by one of ordinary skill in the arts.

These sub-units of the magnetic resonance system 1 are shown only in schematic form in FIG. 3. In particular, the radiofrequency unit 7 may comprise a plurality of sub-units, e.g. a plurality of coils such as the schematically illustrated coils 7.1 and 7.2, or more coils, which can be configured either only to transmit radiofrequency signals or only to receive the triggered radiofrequency signals, or both.

In order to examine an object under examination U, e.g. a patient or also a phantom, this can be placed on a table L in the magnetic resonance system 1 in the measurement volume thereof. The slice or slab Si represents an exemplary target volume of the object under examination from which data is to be acquired and collected as measurement data.

The controller 9 is configured to control the magnetic resonance system 1 and, in particular, can control the gradient unit 5 by means of a gradient controller 5' and the radiofrequency unit 7 by means of a radiofrequency transmit/receive controller 7' (RF transceiver controller 7'). The radiofrequency unit 7 can comprise a plurality of channels on which signals can be transmitted or received.

The radiofrequency unit 7, together with its radiofrequency transmit/receive controller 7', is responsible for generating and applying (transmitting) an alternating RF field for manipulating the spins in a region to be manipulated (e.g. in slices S to be measured) of the object under examination U. The center frequency of the alternating RF field, also referred to as the B1 field, is generally set as close as possible to the resonance frequency of the spins to be manipulated. Deviations of the center frequency from the resonance frequency are termed off-resonance. To generate the B1 field, controlled currents are applied to the RF coils in the RF unit 7 by means of the RF transmit/receive controller 7'.

In addition, the controller 9 comprises a calibration data determining unit (calibrator) 15 by means of which calibration data, in particular second calibration data, can be determined to supplement subsampled sets of measurement data. Altogether, the controller 9 is configured to carry out a method according to the disclosure.

A computing device (computer) 13 incorporated in the controller 9 is configured to perform all the computing operations necessary for the required measurements and determinations. In an exemplary embodiment, the computing device 13 (and/or one or more components therein) includes processing circuitry configured to perform one or more functions and/or operations of the computing device 13. Intermediate results and results required for this purpose or obtained here can be stored in a memory S of the controller 9. The units of the controller 9 shown here are not necessarily to be understood as physically separate units, but merely represent a subdivision into notional entities that can also be implemented e.g. in fewer or even in a single physical unit.

Via an input/output device I/O of the magnetic resonance system 1, control commands can be fed to the magnetic resonance system e.g. by a user, and/or results of the controller 9 such as image data, for example, can be displayed.

A method described herein can also be in the form of a computer program product which comprises a program and implements the described method on a controller 9 when it is executed on the controller 9. An electronically readable data carrier 26 having electronically readable control information stored thereon may also be present which comprises at least one such computer program product and is configured to carry out the described method when the data carrier 26 is used in a controller 9 of a magnetic resonance system 1.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof.

Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for acquiring measurement data of an object under examination by a magnetic resonance system, the method comprising:
   acquiring a first subsampled set of diffusion-weighted measurement data with switching of diffusion gradients for diffusion encoding of the measurement data, using a first echo spacing;
   acquiring a second subsampled set of non-diffusion-weighted measurement data using the first echo spacing; and
   supplementing the first subsampled set of diffusion-weighted measurement data to produce a first complete set of measurement data and supplementing the second subsampled set of non-diffusion-weighted measurement data to produce a second complete set of measurement data using calibration data,
   wherein at least first calibration data used for supplementing the second subsampled set of non-diffusion-weighted measurement data to produce a second complete set of measurement data has been acquired in accordance with the first echo spacing.

2. The method as claimed in claim 1, wherein the first subsampled set of diffusion-weighted measurement data is supplemented to produce a first complete set of measurement data using second calibration data acquired according to a second echo spacing, wherein the first echo spacing and the second echo spacing are different.

3. The method as claimed in claim 2, wherein the first calibration data is obtained from a first subsampled set of measurement data.

4. The method as claimed in claim 2, wherein the first calibration data is obtained from a first complete set that has been supplemented using second calibration data acquired according to a second echo spacing.

5. The method as claimed in claim 2, wherein a subsampled first set of measurement data, from which the first calibration data is determined, has been acquired with diffusion encoding corresponding to a low b-value and/or extending in a diffusion direction insensitive to noise.

6. The method as claimed in claim 2, wherein a first complete set of measurement data supplemented from a subsampled first set of measurement data using second calibration data corresponds to the first calibration data.

7. The method as claimed in claim 2, wherein a subsampled first set of measurement data from which the first calibration data is obtained is acquired prior to acquisition of other subsampled first sets of measurement data and/or prior to acquiring subsampled second sets of measurement data.

8. The method as claimed in claim 2, wherein the first echo spacing is greater than the second echo spacing.

9. The method as claimed in claim 2, wherein second calibration data is acquired in a single shot.

10. The method as claimed in claim 2, wherein first image data is reconstructed from first complete sets of measurement data and second image data is reconstructed from second complete sets of measurement data.

11. The method as claimed in claim 10, wherein image data is reconstructed from complete sets of measurement data, each of which has been supplemented with the same calibration data.

12. The method as claimed in claim 1, wherein subsampled measurement data is supplemented in at least one k-space direction.

13. A computer program product, embodied on a non-transitory computer-readable storage medium, having computer program code and that is loadable into a memory of a controller of a magnetic resonance system, that when executed by the controller, causes the controller to perform the method of claim 1.

14. A non-transitory computer-readable storage medium with an executable program stored thereon, that when executed, instructs a processor to perform the method of claim 1.

15. A magnetic resonance (MR) system comprising:
   a magnetic resonance (MR) scanner; and
   a controller that is configured to:
      control the MR scanner to acquire a first subsampled set of diffusion-weighted measurement data with switching of diffusion gradients for diffusion encoding of the measurement data, using a first echo spacing;
      control the MR scanner to acquire a second subsampled set of non-diffusion-weighted measurement data using the first echo spacing; and
      supplement the first subsampled set of measurement data to produce a first complete set of measurement data and supplementing the second subsampled set of measurement data to produce a second complete set of measurement data using calibration data,
wherein at least the first calibration data used for supplementing the second subsampled set of measurement data to produce a second complete set of measurement data has been acquired in accordance with the first echo spacing.

16. The MR system as claimed in claim 15, wherein the MR scanner comprises a magnet unit, a gradient unit, and a radiofrequency unit, and wherein the controller comprises a radio frequency transmission/reception controller and a calibration data determining unit.

17. The MR system as claimed in claim 15, wherein the controller is further configured to generate an electronic data signal corresponding to the first complete set of measurement data and the second complete set of measurement data and provide the electronic data signal as an output signal of the controller.

18. The MR system as claimed in claim 15, wherein the controller is further configured to reconstruct first image data based on the first complete set of measurement data and reconstruct second image data based on the second complete set of measurement data.

\* \* \* \* \*